US009553238B2

(12) United States Patent
Kashimoto et al.

(10) Patent No.: US 9,553,238 B2
(45) Date of Patent: Jan. 24, 2017

(54) METHOD OF MANUFACTURING LIGHT EMITTING ELEMENT

(71) Applicant: Nichia Corporation, Anan-shi, Tokushima (JP)

(72) Inventors: Kazuki Kashimoto, Tokushima (JP); Masafumi Itasaka, Itano-gun (JP); Hisashi Kasai, Tokushima (JP); Naoki Azuma, Katsuura-gun (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/947,716

(22) Filed: Nov. 20, 2015

(65) Prior Publication Data

US 2016/0149085 A1    May 26, 2016

(30) Foreign Application Priority Data

Nov. 21, 2014   (JP) .................................. 2014-237127

(51) Int. Cl.
*H01L 21/00* (2006.01)
*H01L 33/38* (2010.01)
*H01L 33/08* (2010.01)

(52) U.S. Cl.
CPC ............. *H01L 33/385* (2013.01); *H01L 33/08* (2013.01); *H01L 33/382* (2013.01); *H01L 2933/0016* (2013.01)

(58) Field of Classification Search
CPC ................. H01L 33/385; H01L 33/382; H01L 2933/0016
See application file for complete search history.

(56) References Cited

U.S. PATENT DOCUMENTS

| | | | |
|---|---|---|---|
| 7,700,960 B2* | 4/2010 | Kim ...................... | H01L 33/42 257/72 |
| 2013/0214320 A1 | 8/2013 | Onishi et al. | |
| 2015/0129924 A1* | 5/2015 | Onishi .................... | H01L 33/44 257/99 |
| 2016/0064611 A1* | 3/2016 | Choi ..................... | H01L 33/382 257/98 |

FOREIGN PATENT DOCUMENTS

| | | |
|---|---|---|
| JP | 2008-227018 A | 9/2008 |
| JP | 2013-171982 A | 9/2013 |

* cited by examiner

*Primary Examiner* — Bradley K Smith
(74) *Attorney, Agent, or Firm* — Foley & Lardner LLP

(57) ABSTRACT

A method of manufacturing a semiconductor light emitting element includes forming a semiconductor stacked layer body on a substrate, the semiconductor stacked layer body including a first semiconductor layer and a second semiconductor layer; removing a portion of the semiconductor stacked layer body and exposing the first semiconductor layer such that the second semiconductor layer includes an extending portion that extends in a plane direction; forming a conductor layer electrically connecting the first semiconductor layer and the extending portion of the second semiconductor layer; forming a first electrode electrically connected to the first semiconductor layer and a second electrode electrically connected to the second semiconductor layer; forming a protective film covering at least a portion of the first electrode and at least a portion of the second electrode; and after forming the protective film, removing a portion of the exposed portion of the extending portion.

20 Claims, 11 Drawing Sheets

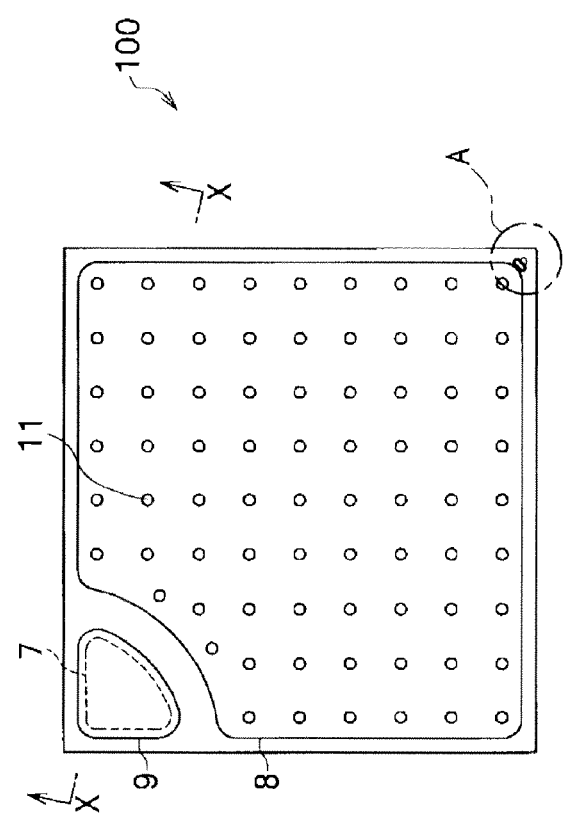
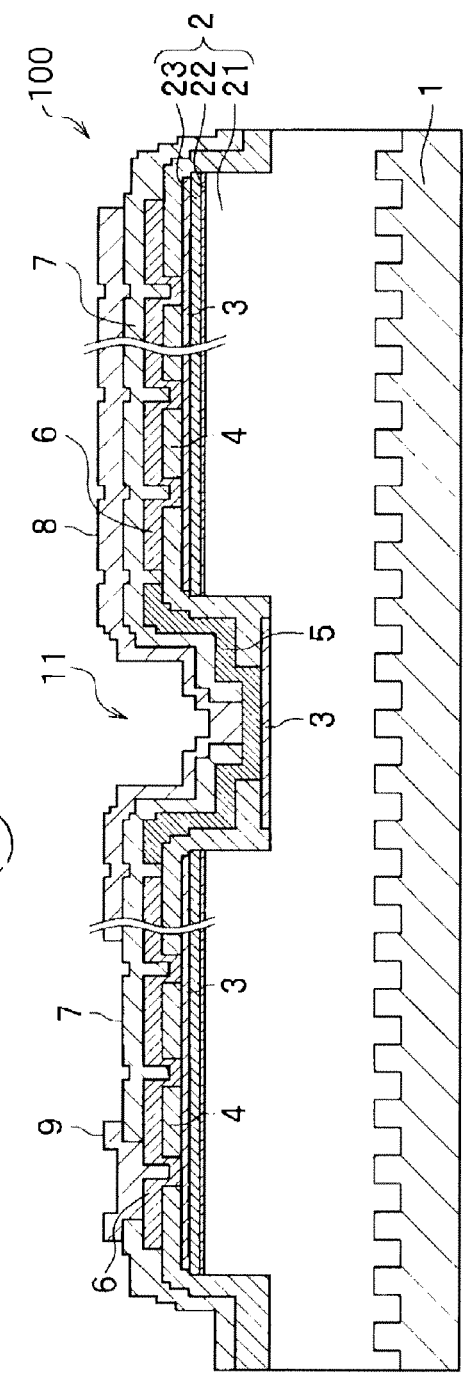
FIG. 1A
FIG. 1B

METHOD OF MANUFACTURING LIGHT EMITTING ELEMENT

CROSS-REFERENCE TO RELATED APPLICATION

This application claims priority to Japanese Patent Application No. 2014-237127 filed on Nov. 21, 2014. The entire disclosure of Japanese Patent Application No. 2014-237127 is hereby incorporated herein by reference.

BACKGROUND

1. Technical Field

The present disclosure relates to a method of manufacturing a semiconductor light emitting element having an electrode made of a metal material on a surface of the semiconductor stacked layer body.

2. Description of the Related Art

A semiconductor light emitting element has a semiconductor stacked layer body which is formed by successively stacking an n-type semiconductor layer and a p-type semiconductor layer on a substrate, and is configured to emit light upon applying electric current to the semiconductor stacked layer body. On the semiconductor stacked layer body, electrodes for supplying current are formed, which are then covered with a protective film made of an insulating material for preventing occurrence of short circuit. In manufacturing such a semiconductor light emitting element, a method for simultaneously manufacturing a plurality of elements may be adopted.

Generally, the electrodes of the semiconductor light emitting elements are made of a metal material and formed by using a lift-off method. First, a photoresist is applied to the entire upper surface of the semiconductor stacked layer body and then by using a photolithography method, openings are formed in the photoresist where the electrodes are to be formed. A metal layer is formed on the entire upper surface of the semiconductor stacked layer body and then the metal layer formed on the photoresist is removed by performing lift-off processing. Thus, the electrodes are formed at the predetermined locations.

However, with this method, migration of the material of the electrodes such as Ag may occur at the time of lift-off, resulting in deposition of metal at various locations of the semiconductor stacked layer body. The deposited metal may cause a short circuit between the n-type semiconductor layer and the p-type semiconductor layer, due to metal migration. Thus, metal migration has to be prevented as much as possible. For this reason, a metal such as Ag which is likely to cause migration has been deemed inappropriate as a material for electrodes.

On the other hand, Ag is a material that has both high conductivity and high reflectance, which creates a strong demand for its use as the material of the electrodes in semiconductor light emitting elements, in order to improve the luminous efficiency of the semiconductor light emitting elements.

Accordingly, for example, in a method of manufacturing a semiconductor light emitting element described in JP 2013-171982, the potential difference between the n-type semiconductor layer and the p-type semiconductor layer, which may be a factor in the occurrence of migration, is canceled by causing short-circuit between the n-type semiconductor layer and the p-type semiconductor layer using a conductive material (e.g., a conductor layer). The electrodes are formed in a state where the potential difference is canceled, thus, preventing the migration of the material, such as Ag, of the electrodes.

In the technologies described in JP 2013-197197A, after canceling the potential difference between the n-type semiconductor layer and the p-type semiconductor layer, a conductor layer made of a material such as ITO is removed by etching, thus eliminating occurrence of short-circuit. However, particles of a metal material generated at the time of etching the conductor layer may adhere to the semiconductor light emitting element, which requires further improvement in the method.

SUMMARY

In order to address the above-mentioned problems, a method of manufacturing a semiconductor light emitting element according to certain embodiments of the present invention includes forming a semiconductor stacked layer body by stacking a first semiconductor layer and a second semiconductor layer having different conductivity types on a substrate, forming an extending portion of the second semiconductor layer extending in a plane direction by removing a portion of the semiconductor stacked layer body and exposing the first semiconductor layer, forming a conductor layer connecting the first semiconductor layer and the second semiconductor layer so as to expose a portion of upper surface of the semiconductor stacked layer body at the extending portion, forming electrodes of a first electrode electrically connected to the first semiconductor layer and a second electrode electrically connected to the second semiconductor layer, after the step of forming the conductor layer, forming a protective film covering the first electrode and the second electrode, and removing a portion of the semiconductor stacked layer body exposed from the conductor layer of the extending portion, after the step of forming the protective film.

With the method of manufacturing a semiconductor light emitting element according to certain embodiments of the present invention, the potential difference between the first semiconductor layer and the second semiconductor layer can be canceled by connecting the first semiconductor layer and the second semiconductor layer via a conductor layer. Thus, migration at the time of forming the electrodes can be prevented. Further, occurrence of short circuit can be prevented without etching the conductor layer, so that generation of particles at the time of removing the conductor layer can be also prevented, and accordingly, a highly reliable semiconductor light emitting element can be manufactured.

BRIEF DESCRIPTION OF THE DRAWINGS

FIGS. 1A and 1B are schematic diagram showing a semiconductor light emitting element according to a first embodiment of the present invention, where FIG. 1A is a plan view and FIG. 1B is a cross-sectional view taken along the line X-X of FIG. 1A.

FIG. 10A is a plan view and FIG. 10B is a cross-sectional view taken along the line X-X of FIG. 10A.

DETAILED DESCRIPTION OF EMBODIMENTS

Figure 2A:
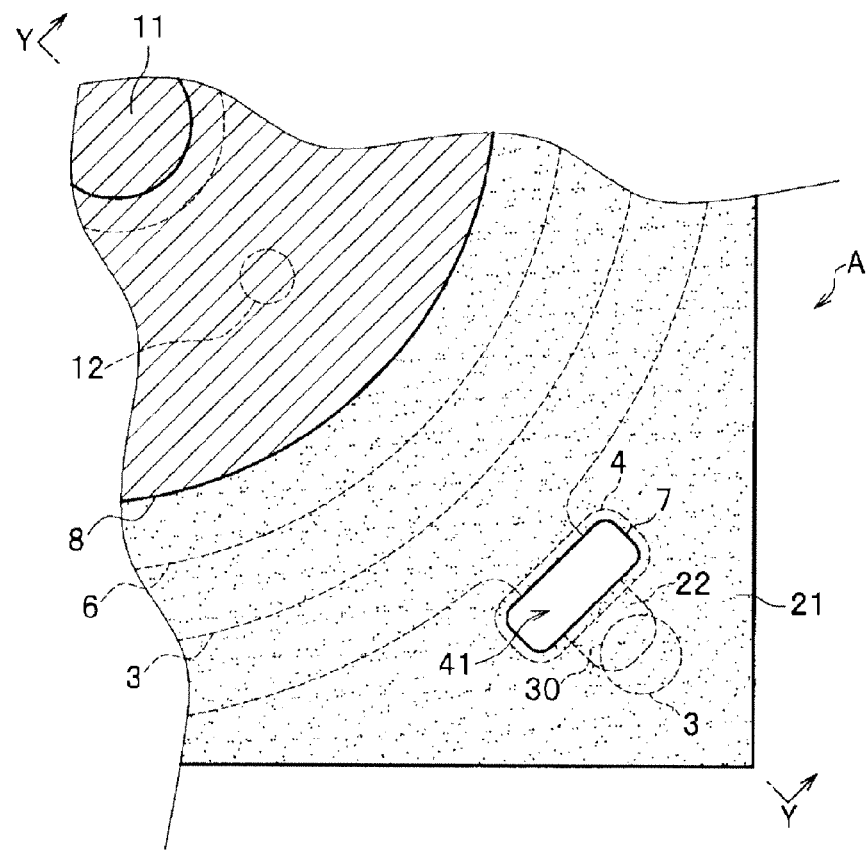
FIG. 2A is an enlarged plan view of a region A of FIG. 1A

Next, a method of manufacturing a semiconductor light emitting element as an example of embodiments according to the present invention will be described with reference to the drawings. The sizes and the arrangement relationships of the members in each of drawings are occasionally shown exaggerated for ease of explanation. In the description below, the same designations or the same reference numerals denote the same or like members and duplicative descriptions will be appropriately omitted.

First Embodiment

Semiconductor Light Emitting Element

A light emitting device according to a first embodiment will be described. As shown in FIGS. 1A and 1B, the semiconductor light emitting element 100 of the first embodiment mainly includes a substrate 1, a semiconductor stacked layer body 2 disposed on the substrate 1, a conductor layer 3 disposed on the semiconductor stacked layer body 2, a dielectric multilayer film 4 disposed on the conductor layer 3, a first electrode (an n-side electrode) 5 and a second electrode (a p-side electrode) 6 disposed on the dielectric multilayer film 4, a protective film 7 covering the n-side electrode 5 and the p-side electrode 6, and a first connection electrode (an n-side connection electrode) 8 and a second connection electrode (a p-side connection electrode) 9 disposed on the protective film 7.

Substrate

The material of the substrate 1 is selected to allow epitaxial growth of a nitride semiconductor layer 2 thereon; the size, the thickness, and the like are not specifically limited. For example, in the case of growing the semiconductor stacked layer body 2 by using a nitride semiconductor such as GaN, an insulating substrate such as a sapphire with a principal plane of C-plane, R-plane, or A-plane, and a spinel ($MgAl_2O_4$), or SiC, ZnS, ZnO, Si, GaAs, or diamond, or an oxide substrate that lattice matches with a nitride semiconductor such as lithium niobate and neodymium gallate can be used.

Semiconductor Stacked Layer Body

The semiconductor stacked layer body 2 includes a first semiconductor layer (an n-type semiconductor layer) 21 and a second semiconductor layer (a p-type semiconductor layer) 23 stacked in this order on the substrate 1. In the first embodiment, an active layer 22 is provided between the n-type semiconductor layer 21 and the p-type semiconductor layer 23. In the first embodiment, the semiconductor light emitting element 100 has a substantially rectangular shape in a plan view, and at an outer peripheral edge portion of the semiconductor light emitting element 100, all of the p-type semiconductor layer 23 and the active layer 22 and a portion of the n-type semiconductor layer 21 are removed from the upper surface of the semiconductor stacked layer body 2. With this configuration, a step portion 50 is formed with the upper surface and a lateral surface of the n-type semiconductor layer 21, the lateral surface of the active layer 22, and the upper surface and the lateral surface of the p-type semiconductor layer 23 (see FIG. 3). In the specification, the term an "outer peripheral edge portion of the semiconductor light emitting element 100" refers to a region from the outermost periphery of the semiconductor light emitting element 100 to a predetermined position in the in-plane direction. In addition, in the plan view of the semiconductor light emitting element 100, the semiconductor stacked layer body 2 defines a plurality of first holes 11 that are formed by removing all of the p-type semiconductor layer 23 and the active layer 22 and a portion of the n-type semiconductor layer 21 from the predetermined locations of the upper surface of the semiconductor stacked layer body 2.

For the n-type semiconductor layer 21, the active layer 22, and the p-type semiconductor layer 23, a nitride semiconductor such as $In_XAl_YGa_{1-X-Y}N$ ($0 \leq X$, $0 \leq Y$, $X+Y<1$) can be suitably used. Those semiconductor layers may respectively have a single-layer structure, but have a stacked-layer structure, a superlattice structure, or the like, which are made of layers of different compositions and thickness. Particularly, the active layer 22 preferably has a single quantum well structure or a multiquantum well structure which is made of stacked layer of thin layers each can produce quantum effect.

Conductor Layer

The conductor layer 3 is a layer for dispersing electric current supplied through the n-side electrode 5 on a portion of the upper layer to the entire surface of the n-type semiconductor layer 21. The conductor layer 3 is also a layer for dispersing electric current supplied through the p-side electrode 6 disposed on a portion of the upper surface to the entire surface of the p-type semiconductor layer 23.

The conductor layer 3 is disposed on the upper surface of the semiconductor stacked layer body 2. In the specification, the expression "disposed on the upper surface of the semiconductor stacked layer body 2" is applied also in the case of disposed on the upper surface of the exposed n-type semiconductor layer 21, in addition to the case of disposed on the upper surface of the p-type semiconductor layer 23. In the first embodiment, the conductor layer 3 is disposed on the upper surface of the p-type semiconductor layer 23 and on the bottom surface of each first hole 11. The locations to dispose the conductor layer 3 can be adjusted according to the type of the semiconductor light emitting element 100 and the like.

The conductor layer 3 can be made of an electrically conducting metal oxide or a metal thin layer in which layers of Au and Ni are stacked. Particularly, an electrically conducting metal oxide which has light-transmissive property is preferably used. Examples of the electrically conducting metal oxide include an oxide that contains at least one element selected from the group consisting of Zn, In, Sn, Ga, and Ti. Among those, ITO (indium tin oxide) is a material which exhibits high light transmissive property in visible light (visible region) and has relatively high electric conductivity, so that it is suitable for the material of the conductor layer 3.

Dielectric Multilayer Film

A dielectric multilayer film 4 is a film in which a pair of dielectrics made of a low refractive index layer and a high refractive index layer is stacked in plural so as to selectively reflect light of a predetermined wavelength. The conductor layer 4 is disposed on the upper surface of the semiconductor stacked layer body 2. In the specification, the expression "disposed on the upper surface of the semiconductor stacked layer body 2" is applied also in the case of disposed on the semiconductor stacked layer body 2 via the conductor layer 3, as well as to the case of disposed on the upper surface of the semiconductor stacked layer body 2. In the first embodiment, the dielectric multilayer film 4 is partially provided on respective location of the upper surface of the conductor layer 3, the bottom surface and the lateral surface defining each hole 11, and the bottom surface and the lateral surface of the step portion 50 (see FIG. 3). The dielectric multilayer film 4 is partially provided on the upper surface of the conductor layer 3 to define a plurality of second holes 12 (see FIG. 9). For the dielectric material, an oxide or a nitride of at least one element selected from the group consisting of Si, Ti, Zr, Nb, Ta, and Al can be suitably used.

First Electrode (n-Side Electrode), Second Electrode (p-Side Electrode)

The n-side electrode 5 and the p-side electrode 6 are electrodes to supply electric current from an external power supply to the semiconductor light emitting element 100. The n-side electrode 5 and the p-side electrode 6 are disposed on the upper surface of the semiconductor stacked layer body 2. In the specification, the expression "disposed on the upper surface of the semiconductor stacked layer body 2" is applied also in the case of disposed on the upper surface of the semiconductor stacked layer body 2 via another layer such as the conductor layer 3 and the dielectric multilayer film 4, as well as to the case of disposed on the upper surface of the semiconductor stacked layer body 2. In the first embodiment, the n-side electrode 5 is disposed on the bottom surface and the lateral surface of each first hole 11, via the conductor layer 3 and the dielectric multilayer film 4. A portion of the n-side electrode 5 is electrically connected to the conductor layer 3 and disposed on the upper surface of the n-type semiconductor layer 21. The p-side electrode 6 is disposed on the upper surface of the semiconductor stacked layer body (upper surface of the p-type semiconductor layer 23) so as not to electrically connected to the n-side electrode 5, via the conductor layer 3 and the dielectric multilayer film 4. A portion of the n-side electrode 5 is electrically connected to the conductor layer 3.

The n-side electrode 5 and the p-side electrode 6 can be made of a metal material, for example, a single metal such as Ag, Al, Ni, Rh, Au, Ti, Pt, and W, or an alloy thereof. For the electrode, a single layer or stacked layer of those metal materials can be employed. In the case of forming an electrode of a stacked layer structure, the lowermost layer (the semiconductor stacked layer body 2 side) is preferably made of Ag which has high reflectance of light, which allows reduction in the absorption of light by the n-side electrode 5 and the p-side electrode 6. Accordingly, the amount of light extracted to the outside can be increased and the luminous efficiency of the semiconductor light emitting element 100 can be enhanced. Regardless of the wavelength, Ag, Al, and an alloy of either of those have high reflectance, and therefore suitable for the light emitting elements of any emission wavelength. In the first embodiment, the n-side electrode 5 and the p-side electrode 6 are made of a same material.

According to the method of manufacturing of an embodiment of the present invention which will be described below, migration of metals that occurs during the manufacturing of the semiconductor light emitting element 100 can be suppressed. Also, the migration of the metal does not easily occur even in the finished semiconductor light emitting elements 100, so that the operation life of the semiconductor light emitting elements 100 can be increased. Even in the case of semiconductor light emitting elements 100 with an emission wavelength in a short wavelength range, Ag exhibits higher reflectance compared to that of other metal materials and good luminous efficiency can be obtained. Thus, the semiconductor light emitting elements 100 according to the first embodiment that allows the use of Ag can be suitably used as the semiconductor light emitting elements of a shorter emission wavelength. More specifically, good reflectance can be obtained with the semiconductor light emitting element 100 having an emission peak wavelength in a range of 420 to 490 nm.

Protective Film

The protective film 7 is an insulating film that covers the surfaces of the n-side electrode 5 and the p-side electrode 6, and serves as the protective film of the semiconductor light emitting element 100. Covering the surfaces of the n-side electrode 5 and the p-side electrode 6 with the protective film 7 suppresses migration of the materials of the n-side electrode 5 and the p-side electrode 6. The protective film 7 covers the surfaces of the n-side electrode 5 and the p-side electrode 6 except for the portion of the n-side electrode 5 which to be connected to the n-side connection electrode 9 and the portion of the p-side electrode 6 which to be connected to the p-side connection electrode 9. For the materials of the protective layer 7, an insulating material such as at least an oxide of element selected from the group consisting of Si, Ti, and Ta, or SiN can be used.

First Connection Electrode (n-Side Connection Electrode), Second Connection Electrode (p-Side Connection Electrode)

The n-side connection electrode 8 and the p-side connection electrode 9 are electrodes to supply electric current from an external power supply to the semiconductor light emitting element 100. The n-side connection electrode 8 is disposed connected to the n-side electrode 5 and extending on the protective film 7. The p-side connection electrode 9 is disposed connected to the p-side electrode 6 and extending on the protective film 7 so as not to electrically connect to the n-side connection electrode 8. The n-side connection electrode 8 and the p-side connection electrode 9 are disposed so as to expose a portion of the protective film 7 at the outer peripheral edge portion of the semiconductor light emitting element 100 and at regions such as a portion between the spaced-apart n-side connection electrode 8 and p-side connection electrode 9. The n-side connection electrode 8 and the p-side electrode 9 increase the contact area and improve the adhesion between the semiconductor light emitting element 100 and the mounting substrate at the time of flip-chip mounting the semiconductor light emitting element 100 on the mounting substrate, and thus mountability of the semiconductor light emitting element 100 can be improved.

The n-side connection electrode 8 and the p-side connection electrode 9 can be made of a metal material, for example, a single metal such as Ag, Al, Ni, Rh, Au, Ti, Pt, and W, or an alloy thereof. For the configuration of the n-side connection electrode 8 and the p-side connection electrode 9, a single layer or stacked layer of one or more of those metal materials can be employed.

Other Aspects

Figure 2B:
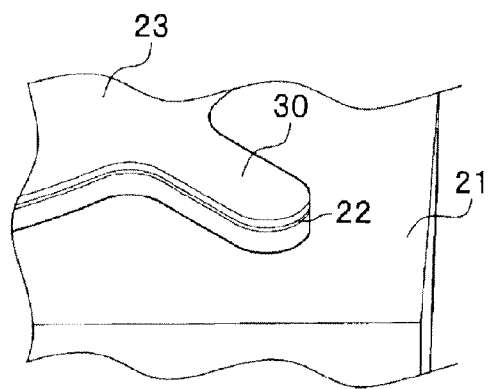
FIG. 2B is a schematic perspective view of an extending portion.

The semiconductor light emitting element 100 can be produced according to a method described below. Accordingly, as shown in FIG. 2A, the extending portion 30, which is a remaining portion after removing the removal region 40 (see FIG. 5), is left in a corner of the semiconductor light emitting element 100 (that is, a corner of the semiconductor stacked layer body 2). The conductor layer 3 remains at the tip of the extending portion 30. Further, a region that is absent of the protective film 7 (i.e., a region in a shape approximating the periphery of a rectangular) and that includes a removed portion 41 where the upper surface of extending portion 30 has been removed, is provided at the periphery of the semiconductor light emitting element 100. FIG. 2B is a schematic perspective view showing the extending portion 30 that is formed in the step of forming the extending portion to be described below, in a state before removing the removal region 40 (see FIG. 5).

Operation of Semiconductor Light Emitting Element

With referring to FIGS. 1A and 1B, operation of a light emitting element 100 according to a first embodiment of the present invention will be described. In the first embodiment, the semiconductor light emitting element 100 is a flip-chip mounting type light emitting diode. In the semiconductor light emitting element 100, the active layer 22 emits light upon being supplied with an electric current to the semiconductor stacked layer body 2 through the n-side connection electrode 8 and the n-side electrode 5, as well as through the p-side connection electrode 8 and the p-side electrode 5. The light emitted by the active layer 22 propagates through the semiconductor stacked layer body 2. The light propagates downward in FIG. 1B is extracted to the outside from the substrate 1 side of the semiconductor light emitting element 100. The light propagates upward in FIG. 1B is reflected downward by the dielectric multilayer film 4, the n-side electrode 5, or the p-side electrode 6 and is extracted to the outside from the substrate 1 side of the semiconductor light emitting element 100.

Method of Manufacturing Light Emitting Element

Next, a method of manufacturing a semiconductor light emitting element according to a first embodiment of the present invention will be described below with reference to FIG. 1A to FIG. 9. The FIG. 3 to FIG. 9 are schematic diagrams respectively illustrating the positional relationship between the plan view and the cross-sectional view of the region A shown in FIG. 1A and FIG. 2A.

The method of manufacturing a semiconductor light emitting element 100 according to the first embodiment includes in the order of forming a semiconductor stacked layer body, forming an extending portion, forming a conductor layer, forming a dielectric multilayer film, forming an electrode, forming a protective film, removing, and forming a connection electrode. The respective steps will be described below. The details of each member of the semiconductor light emitting element 100 are as described above and therefore the description thereof may be appropriately omitted.

Forming Semiconductor Stacked Layer Body

The step of forming a semiconductor stacked layer body includes successively stacking an n-type semiconductor layer 21 and a p-type semiconductor layer 23 which have different conductivity on a substrate 1 to form a semiconductor stacked layer body 2. In the step of forming the semiconductor stacked layer body, first, using a nitride semiconductor or the like, respective layers constituting an n-type semiconductor layer 21, an active layer 22, and a p-type semiconductor layer 23 are grown on the substrate 1 made of sapphire or the like, by using a MOCVD method or the like. Then, the substrate 1 on which respective semiconductor layers are grown is preferably subjected to an annealing at a temperature of about 600° C. to about 700° C. under a nitrogen atmosphere to reduce the resistance of the p-type semiconductor layer 23.

Forming Extending Portion

Figure 3:
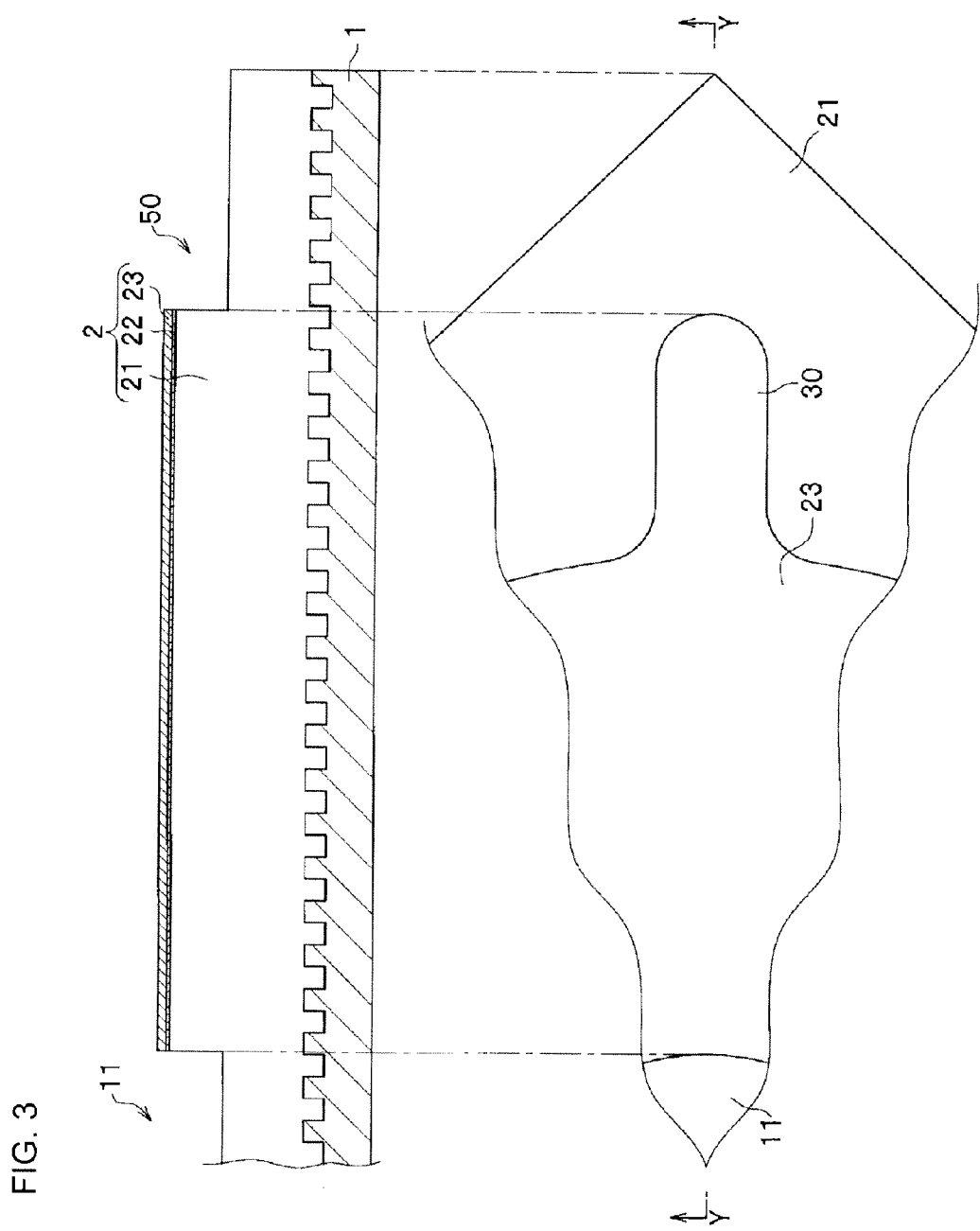
FIG. 3 is a plan view and a cross sectional view taken along the line Y-Y of the plan view, schematically illustrating a part of a method of manufacturing a semiconductor light emitting element according to the first embodiment.

The step of forming an extending portion includes, as shown in FIG. 3, forming an extending portion 30 of the p-type semiconductor layer 21 extending in a plane direction by removing a portion of the semiconductor stacked layer body 2 and exposing the n-type semiconductor layer In the first embodiment, the semiconductor light emitting element 100 has a substantially rectangular shape in a plan view, and at an outer peripheral edge portion of the semiconductor light emitting element 100, a predetermined thickness of the semiconductor stacked layer body 2 is removed from its upper surface side to expose the n-type semiconductor layer 21 at the outer peripheral edge portion. At this time, the extending portion 30 is formed on at least one of four corners of the semiconductor light emitting element 100. The corners of the semiconductor light emitting element 100 allows securing of region for forming the extending portion 30 relatively easy without reducing the light emitting area. In the method of manufacturing according to the first embodiment, the extending portion 30 is provided on one corner of the semiconductor light emitting element 100, but the extending portion 30 may be provided on a plural of corners of the semiconductor light emitting element 100. With this arrangement, the semiconductor light emitting element 100 can be settle in a stable short-circuit state, so that occurrence of migration originated from the n-side electrode 5 and the p-side electrode 6 in the step of forming the electrode, which will be described below, can be more accurately reduced.

The extending portion 30 may have a projecting shape projecting toward outer periphery of the semiconductor stacked layer body 2 in a plan view (in the present embodiment, a rod-shape with rounded end). The length and the width of the extending portion 30 are not specifically limited, and a length of 5 to 50 μm and a width of 1 to 60 μm can be employed. The shape of the extending portion 30 is also not specifically limited. Any appropriate shape in a plan view, such as a rectangular shape, an elliptical shape, or a circular shape, can be employed. Also, the dimensions of the semiconductor stacked layer body 2 is also not specifically limited and for example, a longitudinal dimension of 200 to 2000 μm and a lateral dimension of 200 to 2000 μm can be employed. In the method of manufacturing according to the first embodiment, the light emitting element with a semiconductor stacked layer body of a longitudinal dimension of about 1,400 μm and a lateral dimension of about 1,400 μm is illustrated in the drawings.

The method of removing the semiconductor stacked layer body 2 and a method of forming the extending portion 30 are illustrated below. First, using a photoresist method, a mask of a predetermined shape is formed on the wafer after annealing. Next, using a reactive ion etching (RIE), the p-type semiconductor layer 23 and the active layer 22, and a portion of the n-type semiconductor layer are removed to expose the n-type semiconductor layer 21. After etching, the resist layer is removed.

Forming Conductor Layer

Figure 4:
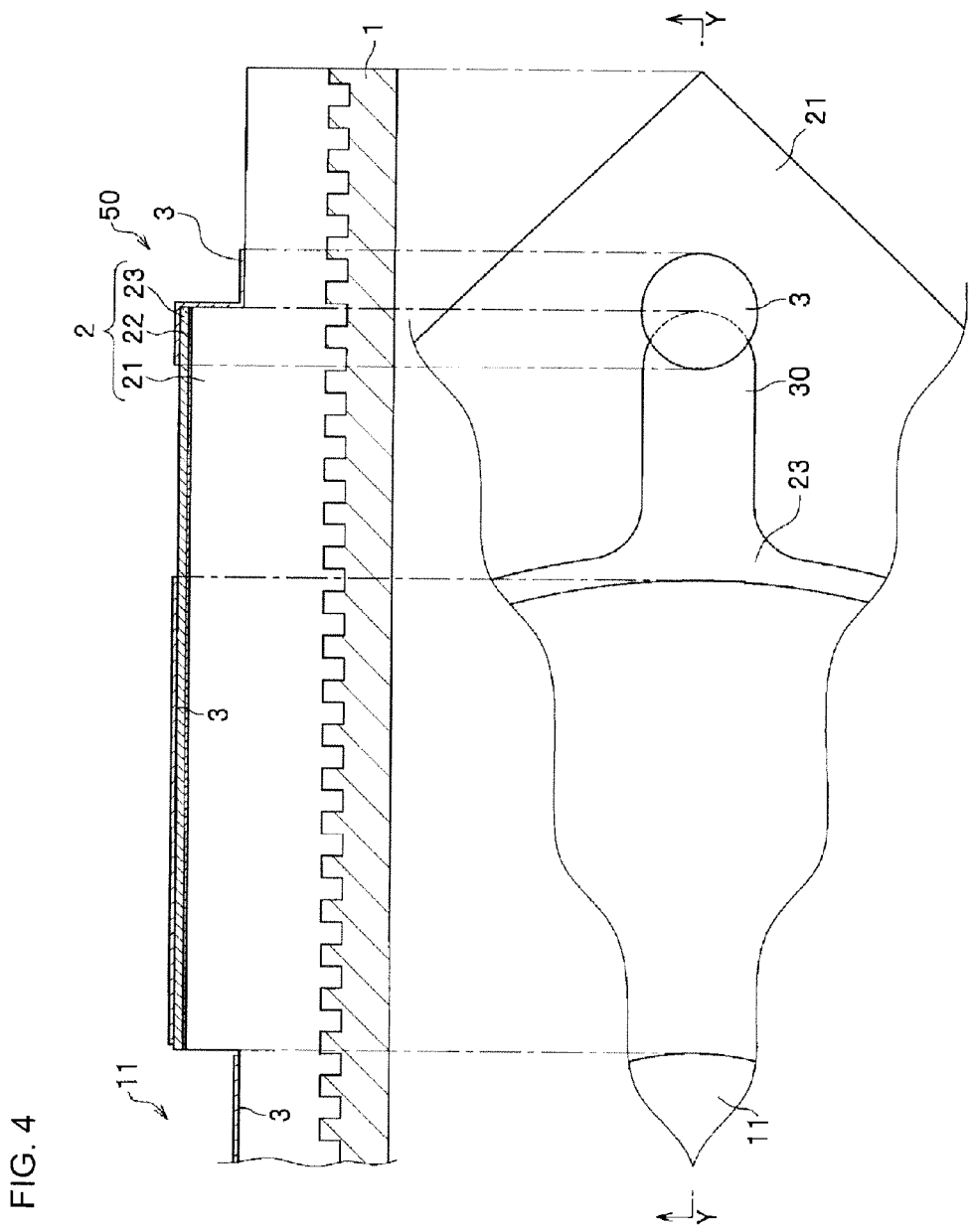
FIG. 4 is a plan view and a cross sectional view taken along the line Y-Y of the plan view, schematically illustrating a part of a method of manufacturing a semiconductor light emitting element according to the first embodiment.

The step of forming the conductor layer includes, as shown in FIG. 4, forming a conductor layer 3 that connects the n-type semiconductor layer 21 and the p-type semiconductor layer 23 so that an upper surface of a portion of the semiconductor stacked layer body 2 at the extending portion 30.

In the first embodiment, the conductor layer 3 is not removed by etching. Thus, a region absent of the conductor layer 3 is provided in order to prevent the conductor layer 3 from being etched at the time of removing a portion of the extending portion 30 in the step of removing to be described below. Accordingly, the conductor layer 3 is disposed so that the upper surface of the semiconductor stacked layer body 2 is exposed in a part of the region on the extending portion 30. The extent of the region is not specifically limited and can be suitably adjusted to facilitate the etching in the step of removing. The extent of the region is preferably determined in view of providing the regions for the dielectric multilayer film 4 and the protective film 7 which will be disposed in the later steps.

In the first embodiment, the n-type semiconductor layer 21 and the p-type semiconductor layer 23 are connected with the conductor layer 3 to create short-circuiting to cancel the potential difference between the n-type semiconductor layer 21 and the p-type semiconductor layer 23 so as to prevent the migration. In the first embodiment, the short-circuit is created at the extending portion 30 by disposing the conductor layer 3 as a continuous layer on the upper surface of the p-type semiconductor layer 23, the lateral surface of the step portion 50, and the upper surface of the exposed n-type semiconductor layer 21. That is, the p-type semiconductor layer 23 of the extending portion 30 and the exposed n-type semiconductor layer 21 are connected with the conductor layer 3 to create short-circuit. The location for disposing the conductor layer 3 in the extending portion 30 is not specifically limited as long as the p-type semiconductor layer 23 and the n-type semiconductor layer 21 are short-circuited, so that, for example, the conductor layer 3 may be disposed only on the lateral surface of the step portion 50. In the first embodiment, the conductor layer 3 at the step portion 50 is formed in a circular shape in a plan view, but the shape of the conductor layer 3 is not specifically limited as long as the p-type semiconductor layer 23 and the n-type semiconductor layer 21 are electrically connected to short-circuit therebetween. Further, the formation range of the conductor layer 3 can be suitably adjusted within a range that can ensure the removal region 40 (see FIG. 5) from which the extending portion 30 is removed in the step of removing.

The conductor layer 3 is preferably disposed so as to connect a tip-side portion of the extending portion 30 and the exposed n-type semiconductor layer 21. That is, it is preferable that the n-type semiconductor layer 21 and the p-type semiconductor layer 23 are connected by the conductor layer 3 at a portion of the step portion 50 formed with the tip-side portion of the extending portion 30 and the exposed n-type semiconductor layer 21. The direction of the "tip-side" of the extending portion 30 refers to the direction toward the outer periphery of the semiconductor light emitting element 100. Connecting the n-type semiconductor layer 21 and the p-type semiconductor layer 23 at the tip-side of the extending portion 30 can facilitate securing the removal region 40 (see FIG. 5).

The conductor layer 3 can be made, for example, by sputtering of ITO. The region with absence of the conductor layer 3 can be formed such that a mask is applied by way of photoresist and then performing lift-off. Other portions to dispose the conductor layer 3 are such that as described in the semiconductor light emitting element 100 above.

Forming Dielectric Multilayer Film

Figure 5:
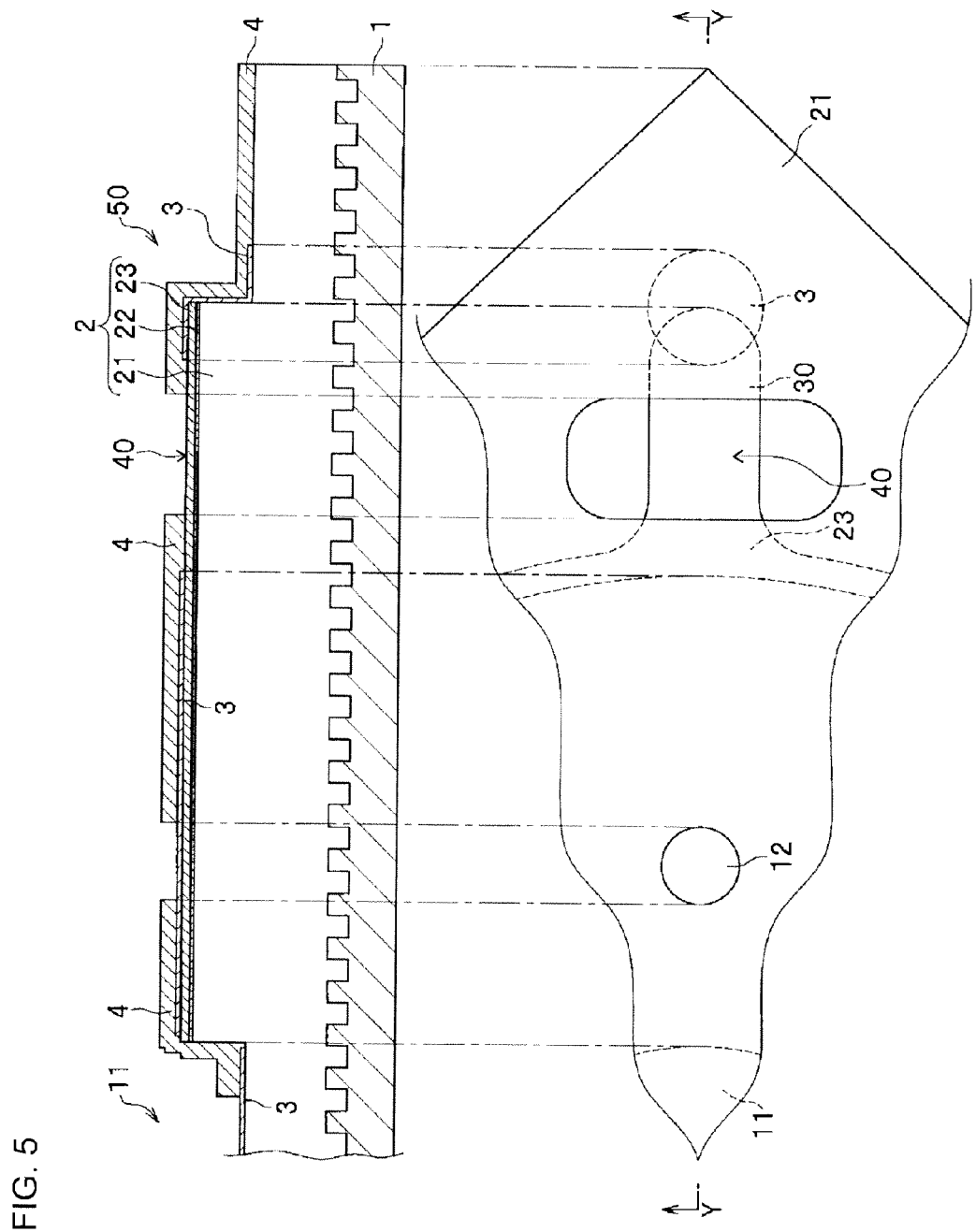
FIG. 5 is a plan view and a cross sectional view taken along the line Y-Y of the plan view, schematically illustrating a part of a method of manufacturing a semiconductor light emitting element according to the first embodiment.

The step of forming a dielectric multilayer film includes, as shown in FIG. 5, forming a dielectric multilayer film 4 on the upper surface of the semiconductor stacked layer body 2. The dielectric multilayer film 4 can be formed by stacking a dielectric material on the semiconductor stacked layer body 2 and the conductor layer 3. The dielectric materials of greatly different refractive indices may be employed in combination (for example, a combination of $SiO_2$ and $ZrO_2$, a combination of $SiO_2$ and $Nb_2O_5$, or the like) and are alternately stacked to form the dielectric multilayer film 4. The region with absence of the dielectric multilayer film 4 can be formed such that a mask is applied by way of photoresist and then performing lift-off.

The dielectric multilayer film 4 is preferably disposed to expose the removal region 40. In the first embodiment, the dielectric multilayer film 4 is not disposed in an approximately rectangular region in a plan view that includes the removal region 40. With a configuration in which the dielectric multilayer film 4 is not disposed in the removal region 40, the dielectric multilayer film 4 can be prevented from scattering around at the time of removing the removal region 40 in the step of removing, and thus, the semiconductor light emitting element 100 having further higher quality can be obtained. Other portions to dispose the dielectric multilayer film 4 are as described above in the semiconductor light emitting element 100.

Forming Electrode

Figure 6:
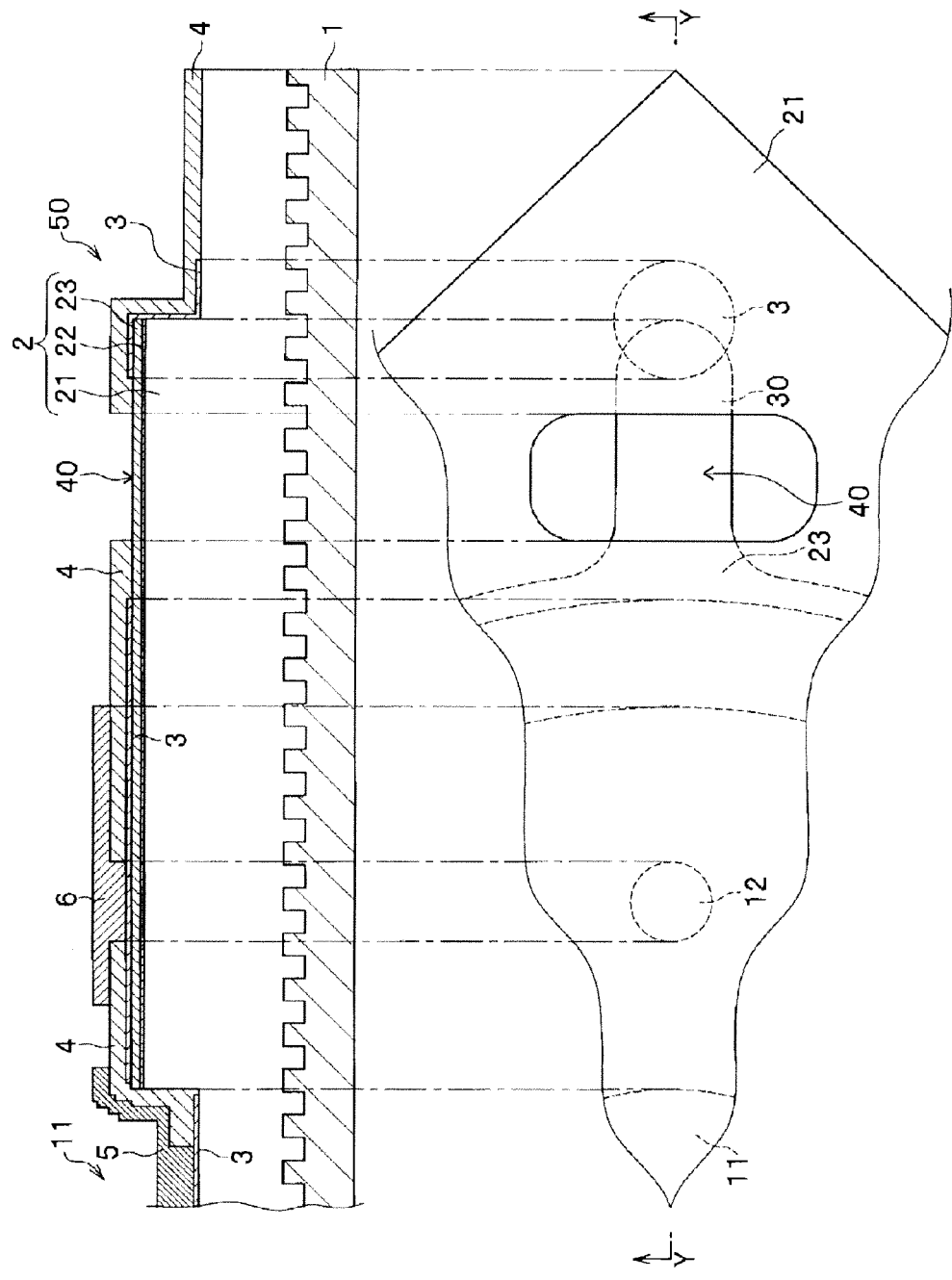
FIG. 6 is a plan view and a cross sectional view taken along the line Y-Y of the plan view, schematically illustrating a part of a method of manufacturing a semiconductor light emitting element according to the first embodiment.

The step of forming electrodes includes, as shown in FIG. 6, forming an n-side electrode 5 electrically connected to the n-type semiconductor layer 21 and a p-side electrode 6 electrically connected to the p-type semiconductor layer 23. The n-side electrode 5 and the p-side electrode 6 are simultaneously formed using a same metal material as described below. First, a photoresist is applied on the whole upper surface of the wafer, and then, the photoresist at the portions to form the electrodes is removed by using a photolithography method. Then, a metal film is disposed on the whole upper surface of the wafer and the metal film disposed on the photoresist is removed by lift-off together with the photoresist. Accordingly, the metal film is remained only at the locations to form the electrodes, on which the n-side electrode 5 and the p-side electrode 6 are respectively formed.

Generally, the lift-off is performed in an environment having a high water content that may accelerate metal migration. However, according to the first embodiment, the potential difference between the n-type semiconductor layer 21 and a type semiconductor layer 23 is canceled through the conductor layer 3 that has been disposed. Thus, the potential difference (electric field intensity) that is attributed to the migration of the metal materials is canceled and therefore the migration can be prevented. Other portions to dispose the n-side electrode 5 and the p-side electrode 6 are as described above in the semiconductor light emitting element 100.

Forming Protective Film

Figure 7:
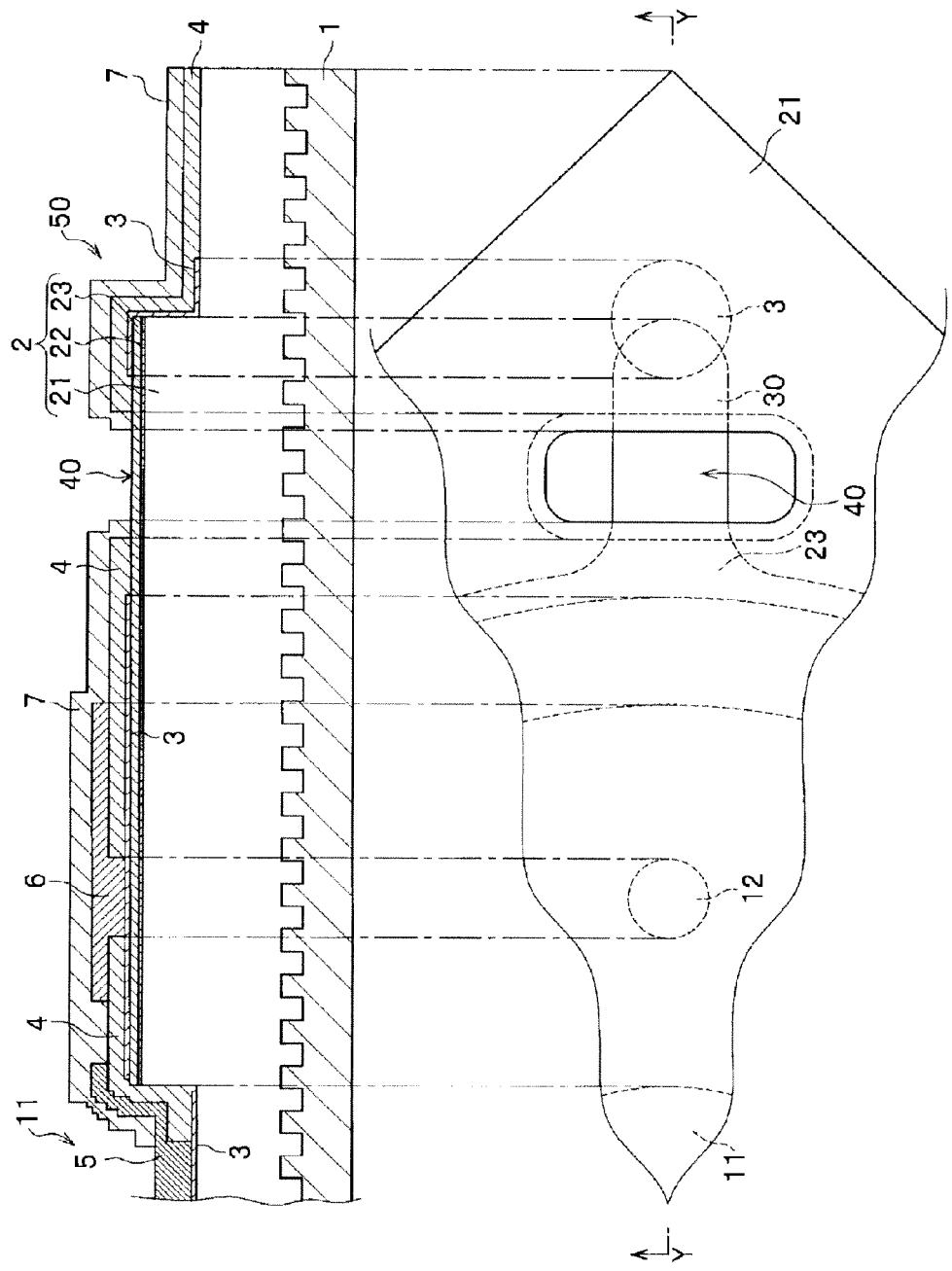
FIG. 7 is a plan view and a cross sectional view taken along the line Y-Y of the plan view, schematically illustrating a part of a method of manufacturing a semiconductor light emitting element according to the first embodiment.

The step of forming a protective film includes, as shown in FIG. 7, forming a protective film 7 that covers the n-side electrode 5 and the p-side electrode 6. The protective film 7 can be, for example, a SiO$_2$ film, and formed by using a known method such as a vapor deposition method or a sputtering method. The regions with absence of the protective film 7 can be formed such that a mask is applied by way of photoresist and then performing lift-off. In the first embodiment, the n-side electrode 5 and the p-side electrode 6 are shielded by the protective film 7. Accordingly, the migration of the metal materials can be prevented in the steps after removing the removal region 40.

The protective film 7 is preferably disposed to expose the removal region 40. In the first embodiment, the protective film 7 is not disposed in an approximately rectangular region in a plan view that includes the removal region 40. With a configuration in which the protective film 7 is not disposed in the removal region 40, the protective film 7 can be prevented from scattering around at the time of removing the removal region 40 in the step of removing, and thus, the semiconductor light emitting element 100 having further higher quality can be obtained. Other portions to dispose the protective film 7 are as described above in the semiconductor light emitting element 100.

Removing

Figure 8:
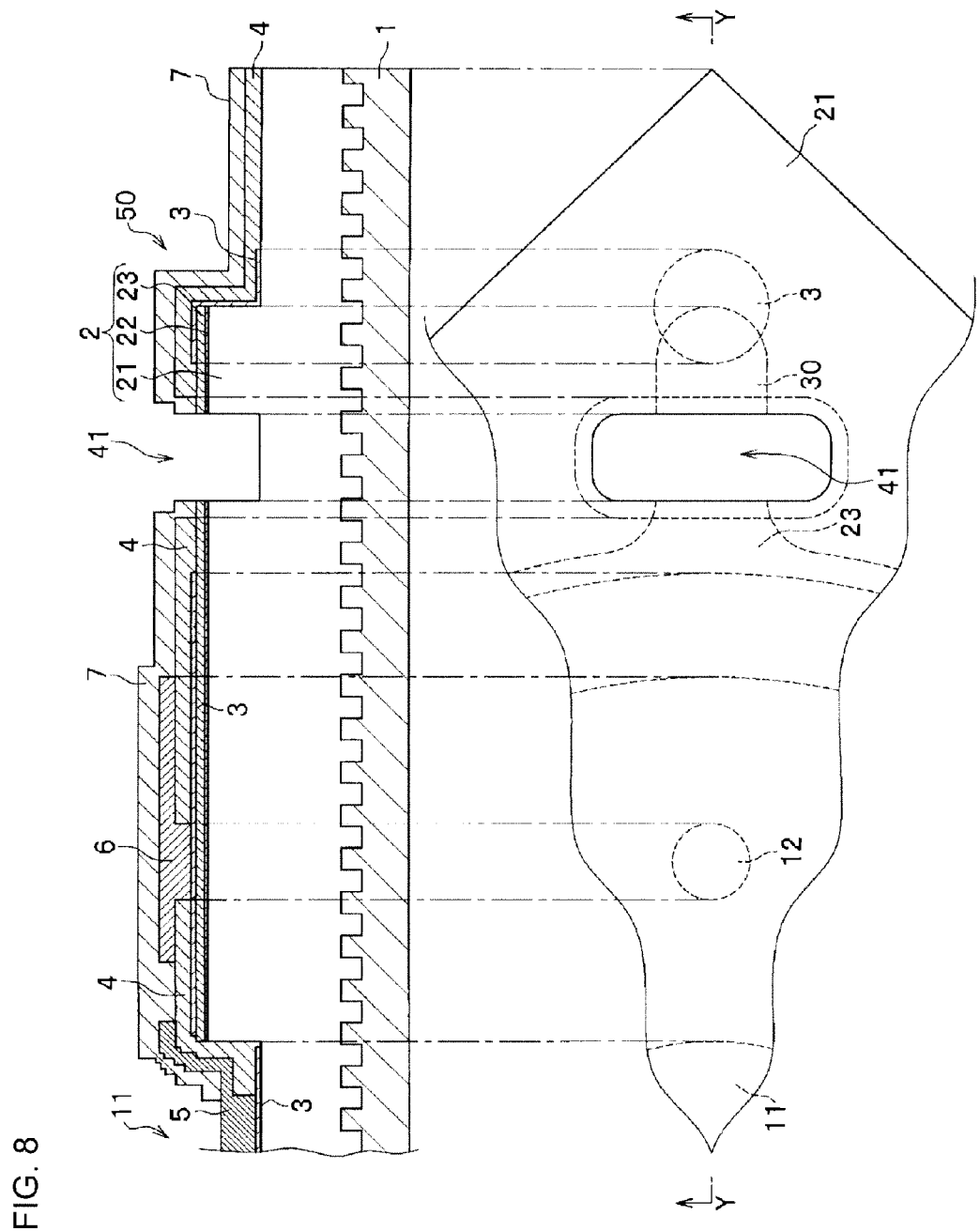
FIG. 8 is a plan view and a cross sectional view taken along the line Y-Y of the plan view, schematically illustrating a part of a method of manufacturing a semiconductor light emitting element according to the first embodiment.

The step of removing includes, as shown in FIG. 8, removing a portion of the semiconductor stacked layer body 2 exposed from the conductor layer 3 of the extending portion 30 so as to expose the n-type semiconductor layer 21. In the step of removing, a portion of the semiconductor stacked layer body 2 exposed from the conductor layer 3 of the extending portion 30 is removed to remove the remaining region of the extending region of the extending portion 30 (in the first embodiment, the region at the tip side of the extending portion 30), and to remove the short-circuit between the n-type semiconductor layer 21 and the p-type semiconductor layer 23.

More specifically, first, a photoresist is applied on the whole upper surface of the wafer, and then, the photoresist at the removal region 40 (see FIG. 7) is removed by using a photolithography method, to form an etching mask. Then, the semiconductor stacked layer body 2 in the removal region 40 is etched to a predetermined depth to remove the semiconductor stacked layer body 2 to expose the n-type semiconductor layer 21. With this, a removed portion 41 is defined in the extending portion 30. Thus, by removing the removal region 40 of the extending portion 30, the short-circuit between the n-type semiconductor layer 21 and the p-type semiconductor layer 23 can be removed in the region other than the region where the extending portion 30 remains. The width of the extending portion 40 can be suitably adjusted in view of each step to perform, and for example, a width of 1 to 60 μm can be employed. With the removal region 40 of equal to or greater than 1 μm in width, a sufficient separation distance between the remaining extending portion 30 and the semiconductor stacked layer body 2 can be obtain, so that occurrence of electrical leakage caused by dust or the like entering the removed portion 41 can be prevented. Further, the removal region 40 of equal to or less than 60 μm in width allows for a reduction in the amount of the semiconductor layer to be removed, which contributes to an improvement in the productivity. The width of the removal region 40 as indicated above is a width in Y-Y direction shown in FIG. 5.

In the step of removing, of the removal portion 40, all the p-type semiconductor layer 23 and the active layer 22 and a portion of the n-type semiconductor layer 21 are removed. The depth of the semiconductor stacked layer body 2 to be removed is not specifically limited as long as the short-circuit between the p-type semiconductor layer 23 and the n-type semiconductor layer 21 can be prevented in the region other than the region where the extending portion 30 remains. After removing the removal region 40 of the extending portion 30, the protective film 7 may be embedded in the removed portion 41.

Forming Connection Electrode

Figure 9:
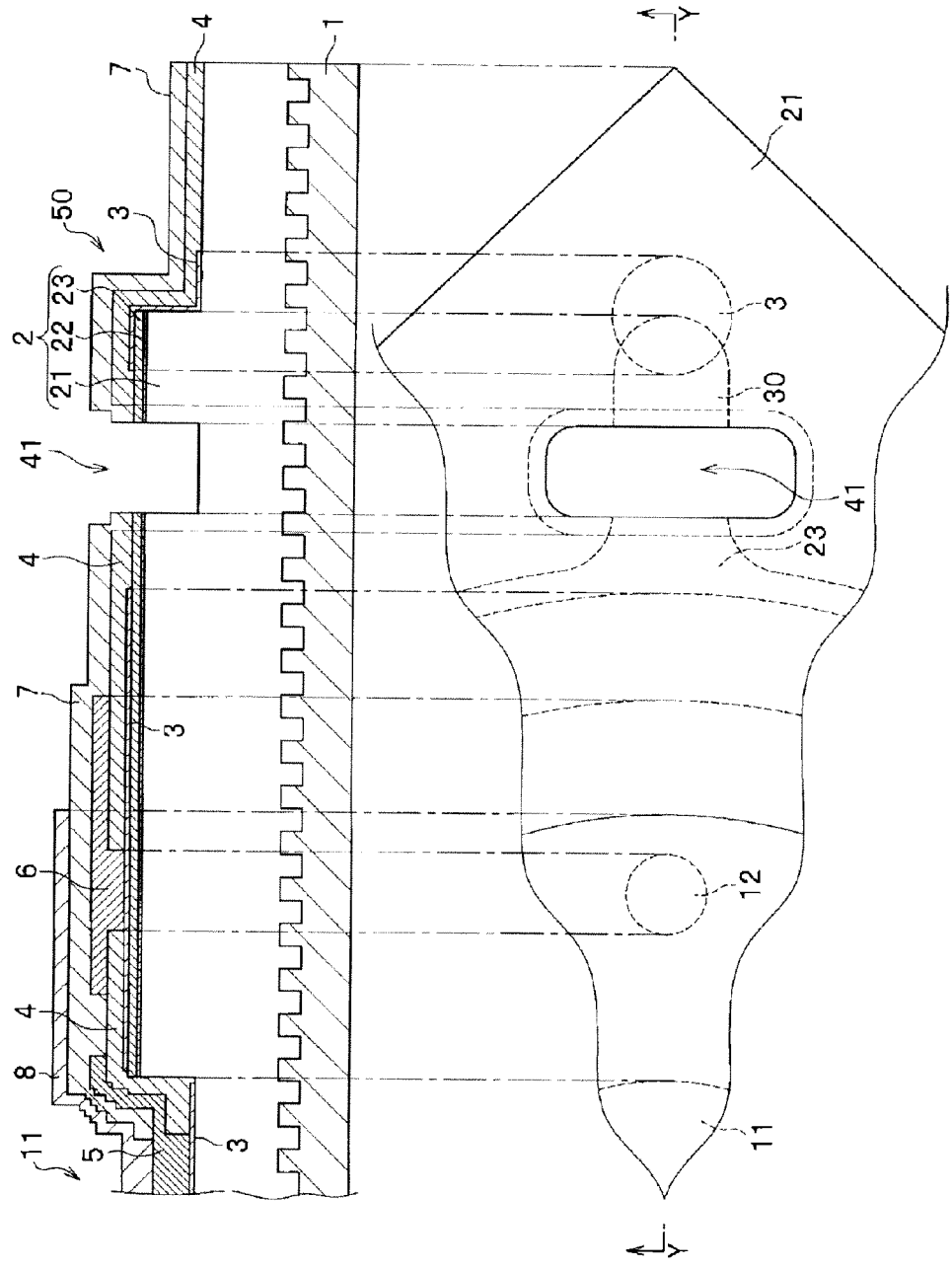
FIG. 9 is a plan view and a cross sectional view taken along the line Y-Y of the plan view, schematically illustrating a part of a method of manufacturing a semiconductor light emitting element according to the first embodiment.

The step of forming connection electrodes includes, as shown in FIG. 9, on the upper surface of the protective film 7, forming an n-side connection electrode 8 electrically connected to the n-side electrode 5 and a p-side connection electrode 9 electrically connected to the p-side electrode 6 (see FIG. 1).

The n-side electrode 8 and the p-side electrode 9 are simultaneously formed using a same metal material as described below. First, a photoresist is applied on the whole upper surface of the wafer, and then, the photoresist at the portions to form the electrodes is removed by using a photolithography method. Then, a metal film is disposed on the whole upper surface of the wafer and the metal film disposed on the photoresist is removed by lift-off together with the photoresist. Accordingly, the metal film is remained only at the locations to form the electrodes, on which the n-side electrode 8 and the p-side electrode 9 are respectively formed. Other portions to dispose the n-side electrode 8 and the p-side electrode 9 are as described above in the semiconductor light emitting element 100.

In the first embodiment, a plurality of units of semiconductor light emitting elements are formed in a matrix on the substrate 1 and, upon completion of the semiconductor light emitting elements 100 on the substrate 1, singulated into chips of each semiconductor light emitting element unit. More specifically, in the step of singulating, the plurality of semiconductor light emitting elements 100 formed on the substrate 1 in a matrix are divided into individual chips by scribing or dicing, to complete each unit of semiconductor light emitting element 100. It is noted that before singulating, the thickness of the substrate 1 may be reduced by grinding the back surface of the substrate 1. In the singulated semiconductor light emitting element 100 according to the first embodiment, the p-type semiconductor layer 23 is prevented from being exposed at the lateral surfaces of the semiconductor light emitting element 100. Accordingly, occurrence of short-circuit between the n-type semiconductor layer 21 and the p-type semiconductor layer 23 caused by a solder material at the time of mounting the semiconductor light emitting element 100 can be prevented. This facilitates mounting of the semiconductor light emitting element in the production of the light emitting devices.

As described above, embodiments of the present invention are illustrated, but the present invention is not limited thereto. Various alternatives should be possible within the scope of the present invention. The preferred embodiments are intended as illustrative of a light emitting device and a method of manufacturing the light emitting device to give a concrete form to technical ideas of the present invention, and the scope of the invention is not limited to those described below. Further, the members shown in claims attached hereto are not specifically limited to members in the embodiments. The sizes, materials, shapes and the relative configuration etc. of the members described in embodiments are given as an example and not as a limitation to the scope of the invention unless specifically described otherwise. Other embodiments according to the present invention will be described below.

Second Embodiment

Semiconductor Light Emitting Element

Figure 10A:
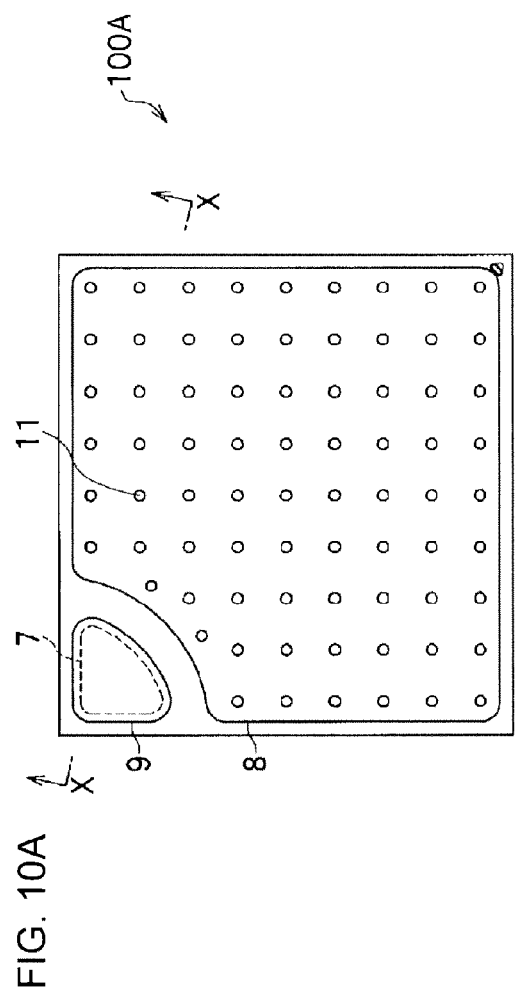
FIGS. 10A and 10B are schematic diagram showing a semiconductor light emitting element according to a second embodiment of the present invention, where
Figure 10B:
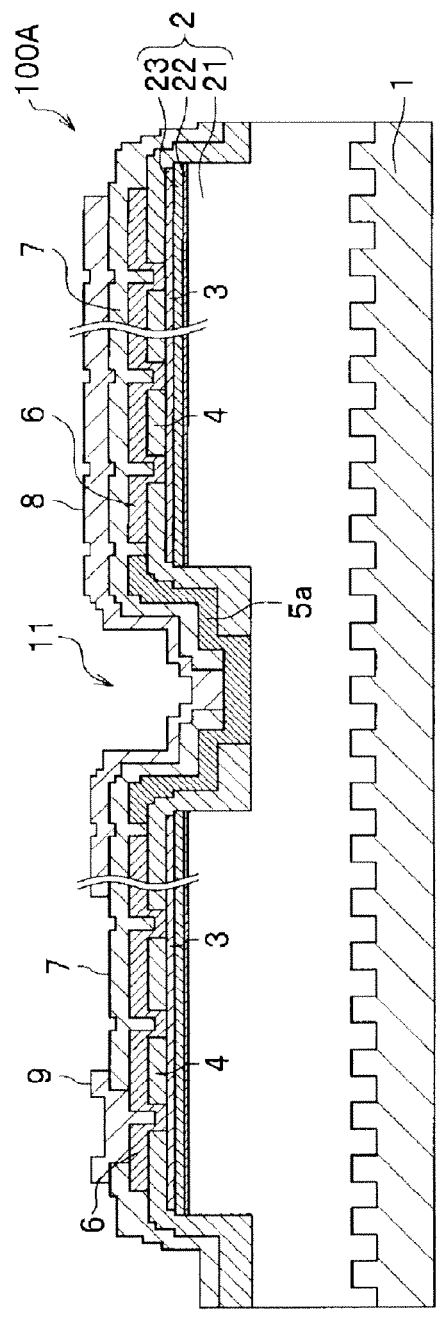

A light emitting element according to a second embodiment of the present invention will be described. As shown in FIGS. 10A and 10B, the semiconductor light emitting element 100A of the second embodiment mainly includes a substrate 1, a semiconductor stacked layer body 2 disposed on the substrate 1, a conductor layer 3 disposed on the semiconductor stacked layer body 2, a dielectric multilayer film 4 disposed on the conductor layer 3, a first electrode (an n-side electrode) 5a and a second electrode (a p-side electrode) 6 disposed on the dielectric multilayer film 4, a protective film 7 covering the n-side electrode 5a and the p-side electrode 6, and a first connection electrode (an n-side connection electrode) 8 and a second connection electrode (a p-side connection electrode) 9 disposed on the protective film 7. A light emitting element 100A according to a second embodiment will be described below mainly regarding portions which are different from the light emitting element 100 according to the first embodiment.

In the semiconductor light emitting element 100 according to the first embodiment, the n-side electrode 5 and the p-side electrode 6 are made of a same material. Meanwhile, in the semiconductor light emitting element 100A according to the second embodiment, the n-side electrode 5a and the p-side electrode 6 are made of different materials. For example, in the semiconductor light emitting element 100A, an Al—Si—Cu-based Al alloy (hereinafter referred to as "ASC layer") may be used as the material of the n-side electrode 5a. For example, the material of the n-side electrode 5a may be Ti/ASC layer/Ti/Pt (stacked in this order) and the material of the p-side electrode may be Ni/Ag/Ni/Ti/Pt (stacked in this order).

The semiconductor light emitting element 100 according to the first embodiment employs a configuration in which the conductor layer 3 is disposed on the bottom surface defining each hole 11. The conductor layer 3 is provided so as to reduce the contact resistance between the n-type semiconductor layer 21 and the n-side electrode 5 that would be high in the case where the n-type semiconductor layer 21 and the n-side electrode 5 are directly in contact with each other. Meanwhile, the semiconductor light emitting element 100A according to the second embodiment employs an ASC layer as the material of the n-side electrode 5a, so that the contact resistance between the n-type semiconductor layer 21 and the n-side electrode 5a can be reduced without the conductor layer 3 on the bottom surface defining each hole 11.

Method of Manufacturing Light Emitting Element

Next, a method of manufacturing a semiconductor light emitting element according to a second embodiment of the present invention will be described with reference to FIGS. 11A to 11C. In the below, a method of manufacturing a semiconductor light emitting element 100A according to the second embodiment will be described mainly on the differences from the method of manufacturing the semiconductor light emitting element 100 according to the first embodiment.

In the method of manufacturing the semiconductor light emitting element 100 according to the first embodiment, in the step of forming the electrodes, the n-side electrode 5 and the p-side electrode 6 are simultaneously formed using a same material. Meanwhile, in the method of manufacturing the semiconductor light emitting element 100A according to the second embodiment, different materials are used for the n-side electrode 5 and the p-side electrode 6, and the step of forming the electrodes is separated in two steps of forming n-side electrode to form the n-side electrode 5a and forming p-side electrode to form the p-side electrode 6. Also, in the step of forming the conductor layer, the conductor layer 3 is not disposed on the bottom surfaces defining the holes 11, and in a similar manner as in the first embodiment, the n-type semiconductor layer 21 and the p-type semiconductor layer 23 are short-circuited by the extending portion 30.

Figure 11A:
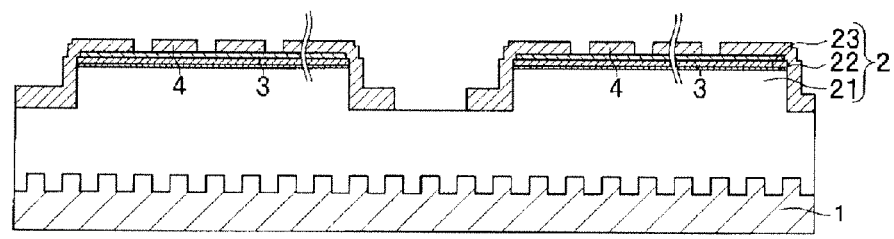
FIG. 11A to 11C are cross schematic sectional views illustrating a part of a method of manufacturing a semiconductor light emitting element according to a second embodiment.
Figure 11B:
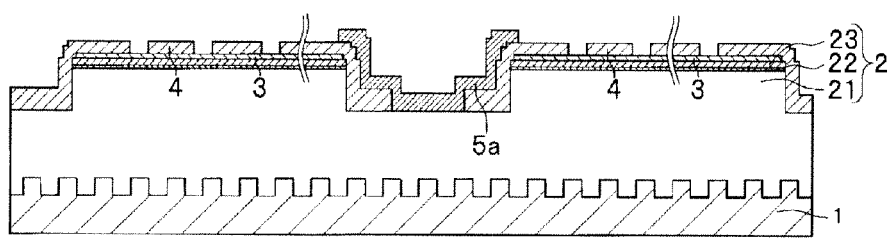
Figure 11C:
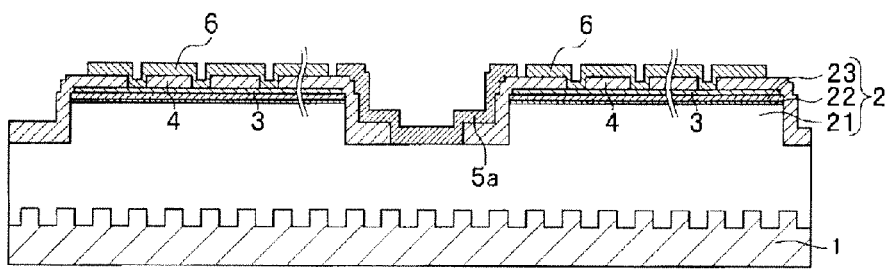

More specifically, the method of manufacturing the semiconductor light emitting element 100A includes, as shown in FIG. 11A to FIG. 11C, without providing the conductor layer 3 on the bottom surfaces defining the holes 11, the dielectric multilayer film 4 is disposed (FIG. 11A), then the n-side electrode 5a is formed (FIG. 11B).

After forming the n-side electrode 5a, the p-side electrode 6 is formed (FIG. 11C). Thus, the semiconductor light emitting element 100A in which the n-side electrode 5a and the p-side electrode 6 are made of different materials is produced. In the method of manufacturing described above, the p-side electrode 6 is formed following to formation of the n-side electrode 5a, but the n-side electrode 5a may be formed following to formation of the p-side electrode 6.

Other Embodiments

In the method of manufacturing the semiconductor light emitting elements 100, 100A described above, the semiconductor light emitting elements 100, 100A have an approximately rectangular shape in a plan view, and the extending portion 30 is formed at a corner portion of the semiconductor light emitting elements 100, 100A. However, the location to dispose the extending portion 30 is not specifically limited and may be disposed at an outer peripheral edge portion other than the corner portions of the semiconductor light emitting elements 100, 100A. Further, the extending portion 30 may be formed at a location inner side on the surface of the semiconductor light emitting elements 100, 100A. For example, forming a larger hole 11 which allows formation of the extending portion 30 in the hole 11. The shape of the semiconductor light emitting elements 100, 100A in a plan view is not also specifically limited, and the location of the extending portion 30 can also be suitably adjusted according to the shape of the semiconductor light emitting elements 100, 100A.

The semiconductor light emitting elements 100, 100A respectively have a configuration that includes a dielectric multilayer film 4, but the dielectric multilayer film 4 may be absent, so that a method of manufacturing may not include the step of forming the dielectric multilayer film 4. The semiconductor light emitting elements 100, 100A have a configuration that includes an n-side connection electrode 8 and a p-side connection electrode 9, but the n-side connection electrode 8 and the p-side connection electrode 9 may be absent, so that a method of manufacturing may not include the step of forming connection electrodes. Further, the n-side connection electrode 8 and the p-side connection electrode 9 may be made of different materials, and the step of forming connection electrodes may be separated in two steps of forming n-side connection electrode and forming p-side electrode, and also either the n-side connection electrode 8 and the p-side connection electrode 9 may be formed earlier than the other.

In the method of manufacturing the light emitting devices 100, 100A, one or more steps other than that described above may be included between the operations or before or after the operations. For example, one or more other steps such as washing substrate to wash the substrate 1, removing unnecessary substances to remove unnecessary substances such as dust, and/or forming a member to form another member may be included. It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A method of manufacturing a semiconductor light emitting element comprising:
    forming a semiconductor stacked layer body on a substrate, the semiconductor stacked layer body comprising a first semiconductor layer and a second semiconductor layer having different conductivity types;
    removing a portion of the semiconductor stacked layer body and exposing the first semiconductor layer such that the second semiconductor layer includes an extending portion that extends in a plane direction;
    forming a conductor layer electrically connecting the first semiconductor layer and the extending portion of the second semiconductor layer such that a portion of an upper surface of the extending portion remains exposed from the conductor layer;
    after forming the conductor layer, forming a first electrode electrically connected to the first semiconductor layer and a second electrode electrically connected to the second semiconductor layer;
    forming a protective film covering at least a portion of the first electrode and at least a portion of the second electrode; and
    after forming the protective film, removing a portion of the exposed portion of the extending portion.

2. The method of manufacturing a semiconductor light emitting element according to claim 1, wherein the extending portion is formed at an end portion of a periphery of the semiconductor light emitting element.

3. The method of manufacturing a semiconductor light emitting element according to claim 1, wherein the semiconductor light emitting element has a substantially rectangular shape in a plan view and the extending portion is formed at a corner of the semiconductor light emitting element.

4. The method of manufacturing a semiconductor light emitting element according to claim 2, wherein the semiconductor light emitting element has a substantially rectangular shape in a plan view and the extending portion is formed at a corner of the semiconductor light emitting element.

5. The method of manufacturing a semiconductor light emitting element according to claim 1, wherein, in the step of forming the conductor layer, the conductor layer is formed so as to connect a tip side portion of the extending portion to the exposed first semiconductor layer.

6. The method of manufacturing a semiconductor light emitting element according to claim 2, wherein, in the step of forming the conductor layer, the conductor layer is formed so as to connect a tip side portion of the extending portion to the exposed first semiconductor layer.

7. The method of manufacturing a semiconductor light emitting element according to claim 3, wherein, in the step of forming the conductor layer, the conductor layer is formed so as to connect a tip side portion of the extending portion to the exposed first semiconductor layer.

8. The method of manufacturing a semiconductor light emitting element according to claim 1, wherein, in the step of forming the electrodes, the first electrode and the second electrode are simultaneously formed using a same material.

9. The method of manufacturing a semiconductor light emitting element according to claim 2, wherein, in the step of forming the electrodes, the first electrode and the second electrode are simultaneously formed using a same material.

10. The method of manufacturing a semiconductor light emitting element according to claim 3, wherein, in the step of forming the electrodes, the first electrode and the second electrode are simultaneously formed using a same material.

11. The method of manufacturing a semiconductor light emitting element according to claim 1, wherein the first electrode and the second electrode are made of different materials, and in the step of forming the electrodes, the second electrode is formed after forming the first electrode.

12. The method of manufacturing a semiconductor light emitting element according to claim 2, wherein the first electrode and the second electrode are made of different materials, and in the step of forming the electrodes, the second electrode is formed after forming the first electrode.

13. The method of manufacturing a semiconductor light emitting element according to claim 1, wherein the first electrode and the second electrode are made of different materials, and in the step of forming the electrodes, the first electrode is formed after forming the second electrode.

14. The method of manufacturing a semiconductor light emitting element according to claim 2, wherein the first electrode and the second electrode are made of different materials, and in the step of forming the electrodes, the first electrode is formed after forming the second electrode.

15. The method of manufacturing a semiconductor light emitting element according to claim 1, further comprising, after the step of forming the conductor layer and before the step of forming the electrodes, forming a dielectric multilayer film on an upper surface of the semiconductor stacked layer body.

16. The method of manufacturing a semiconductor light emitting element according to claim 8, wherein the dielectric multilayer film is formed such that the portion for removing the extending portion in the step of removing is exposed.

17. The method of manufacturing a semiconductor light emitting element according to claim 1, wherein the protective film is formed such that the portion for removing the extending portion in the step of removing is exposed.

18. The method of manufacturing a semiconductor light emitting element according to claim 2, wherein the protective film is formed such that the portion for removing the extending portion in the step of removing is exposed.

19. The method of manufacturing a semiconductor light emitting element according to claim 3, wherein the protective film is formed such that the portion for removing the extending portion in the step of removing is exposed.

20. The method of manufacturing a semiconductor light emitting element according to claim 1, further comprising, after the step of removing, forming, on an upper surface of the protective film, a first connection electrode that is electrically connected to the first electrode and a second connection electrode that is electrically connected to the second electrode.

* * * * *